(12) United States Patent
Matsuoka et al.

(10) Patent No.: US 10,666,278 B2
(45) Date of Patent: May 26, 2020

(54) DA CONVERTER AND DA CONVERSION METHOD

(71) Applicant: Asahi Kasei Microdevices Corporation, Tokyo (JP)

(72) Inventors: Daisuke Matsuoka, Tokyo (JP); Ryuzo Yamamoto, Tokyo (JP); Tatsuya Chubachi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/352,859

(22) Filed: Mar. 14, 2019

(65) Prior Publication Data

US 2019/0288701 A1    Sep. 19, 2019

(30) Foreign Application Priority Data

Mar. 16, 2018  (JP) ................................ 2018-050226

(51) Int. Cl.
  *H03M 1/66*  (2006.01)
  *H03M 1/08*  (2006.01)

(52) U.S. Cl.
  CPC ................................ *H03M 1/0863* (2013.01)

(58) Field of Classification Search
  CPC ............ H03M 3/34; H03M 1/66; H03M 3/50; H03M 1/0607; H03M 1/46; H03M 3/502; H03M 1/0673; H03M 1/1245; H03M 1/765; H03M 3/376; H03M 3/356; H03M 1/001; H03M 1/02
  USPC ................................... 341/118–121, 144, 154
  See application file for complete search history.

(56) References Cited

U.S. PATENT DOCUMENTS

| | | | | |
|---|---|---|---|---|
| 5,477,481 | A * | 12/1995 | Kerth | G01D 3/00 708/819 |
| 7,277,035 | B1 * | 10/2007 | You | H03M 3/34 341/144 |
| 2004/0212525 | A1 * | 10/2004 | Mallinson | H03M 1/0663 341/144 |
| 2005/0122245 | A1 * | 6/2005 | Frith | H03M 3/322 341/150 |
| 2006/0012501 | A1 * | 1/2006 | Lee | H03M 1/682 341/144 |
| 2006/0139193 | A1 * | 6/2006 | Morrow | H03M 3/34 341/143 |
| 2008/0030489 | A1 * | 2/2008 | Kim | G09G 3/3688 345/205 |

(Continued)

*Primary Examiner* — Linh V Nguyen

(57) ABSTRACT

To reduce distortion of output analog signals generated at a current-output DA converter. A DA converter that outputs a differential analog signal corresponding to an input digital signal is provided, including: a current output unit outputting a current corresponding to the digital signal to each of first and second wires; a converting unit outputting, as positive-side and negative-side analog signals, voltage signals based on currents flowing through the first and second wires, respectively; a first noise reducing unit having: a first switch switched to be or not to be electrically connected with the first wire; and a first buffer provided between the first switch and a reference potential; and a second noise reducing unit having: a second switch switched to be or not to be electrically connected with the second wire; and a second buffer provided between the second switch and the reference potential.

17 Claims, 6 Drawing Sheets

(56) References Cited

U.S. PATENT DOCUMENTS

| | | | |
|---|---|---|---|
| 2010/0164765 A1* | 7/2010 | Miyahara | H03M 1/1061 |
| | | | 341/120 |
| 2011/0163901 A1* | 7/2011 | Quiquempoix | H03M 1/0665 |
| | | | 341/143 |
| 2011/0215955 A1* | 9/2011 | Motz | H03M 1/02 |
| | | | 341/110 |
| 2012/0013496 A1* | 1/2012 | Nakamura | H03M 1/0845 |
| | | | 341/150 |
| 2012/0293347 A1 | 11/2012 | McGowan | |

* cited by examiner

DA CONVERTER AND DA CONVERSION METHOD

The contents of the following Japanese patent application(s) are incorporated herein by reference:
NO. 2018-050226 filed in JP on Mar. 16, 2018.

BACKGROUND

1. Technical Field

The present invention relates to a Digital-to-Analog (DA) converter, and a DA conversion method.

2. Related Art

Conventional current-output DA converting circuits each include a current output circuit that feeds current based on an input digital signal, and a converting circuit that outputs an analog voltage corresponding to a current output. Such a DA converting circuit has a switch provided at its current output circuit, and switches the value of current fed to its converting circuit depending on an input digital signal.

SUMMARY

In this manner, since the DA converting circuit uses the switch to switch the current value, switching noise is generated, and analog signals to be output are distorted in some cases. Accordingly, it has been desired to reduce such switching noise, and prevent generation of distortion of output analog signals.

A first aspect of the present invention provides a DA converter that outputs a differential analog signal corresponding to an input digital signal, the DA converter including: a current output unit that outputs a current corresponding to the digital signal to each of a first wire and a second wire; a converting unit that outputs, as a positive-side analog signal, a voltage signal based on a current flowing through the first wire, and outputs, as a negative-side analog signal, a voltage signal based on a current flowing through the second wire; a first noise reducing unit having: a first switch that is switched to be or not to be electrically connected with the first wire; and a first buffer provided between the first switch and a reference potential; and a second noise reducing unit having: a second switch that is switched to be or not to be electrically connected with the second wire; and a second buffer provided between the second switch and the reference potential.

A second aspect of the present invention provides a DA converter that outputs a differential analog signal corresponding to an input digital signal, the DA converter including: a current output unit that outputs a current corresponding to the digital signal to each of a first wire and a second wire; a converting unit that outputs, as a positive-side analog signal, a voltage signal based on a current flowing through the first wire, and outputs, as a negative-side analog signal, a voltage signal based on a current flowing through the second wire; a first noise reducing unit having: a first switch that is switched to be or not to be electrically connected with the first wire; and a first capacitor provided between the first switch and a reference potential; and a second noise reducing unit having: a second switch that is switched to be or not to be electrically connected with the second wire; and a second capacitor provided between the second switch and the reference potential.

A third aspect of the present invention provides a DA converter that outputs a differential analog signal corresponding to an input digital signal, the DA converter including: a current output unit that outputs a current corresponding to the digital signal to each of a first wire and a second wire; a converting unit that outputs, as a positive-side analog signal, a voltage signal based on a current flowing through the first wire, and outputs, as a negative-side analog signal, a voltage signal based on a current flowing through the second wire; a first noise reducing unit that is electrically connected with the first wire, and discharges electric charges corresponding to a noise component generated at the current output unit; and a second noise reducing unit that is electrically connected with the second wire, and discharges electric charges corresponding to a noise component generated at the current output unit.

A fourth aspect of the present invention provides a DA converter that outputs a differential analog signal corresponding to an input digital signal, the DA converter including: a current output unit that outputs a current corresponding to the digital signal to each of a first wire and a second wire; a converting unit that outputs, as a positive-side analog signal, a voltage signal based on a current flowing through the first wire, and outputs, as a negative-side analog signal, a voltage signal based on a current flowing through the second wire; a first reference voltage forcing unit that forces a reference voltage across the first wire; and a second reference voltage forcing unit that forces a reference voltage across the second wire.

A fifth aspect of the present invention provides a DA conversion method of outputting a differential analog signal corresponding to an input digital signal, the DA conversion method including: outputting a current corresponding to the digital signal to each of a first wire and a second wire; electrically connecting a first buffer provided to the first wire with the first wire via a first switch; electrically connecting a second buffer provided to the second wire with the second wire via a second switch; and outputting, as a positive-side analog signal, a voltage signal based on a current flowing through the first wire, and outputting, as a negative-side analog signal, a voltage signal based on a current flowing through the second wire.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
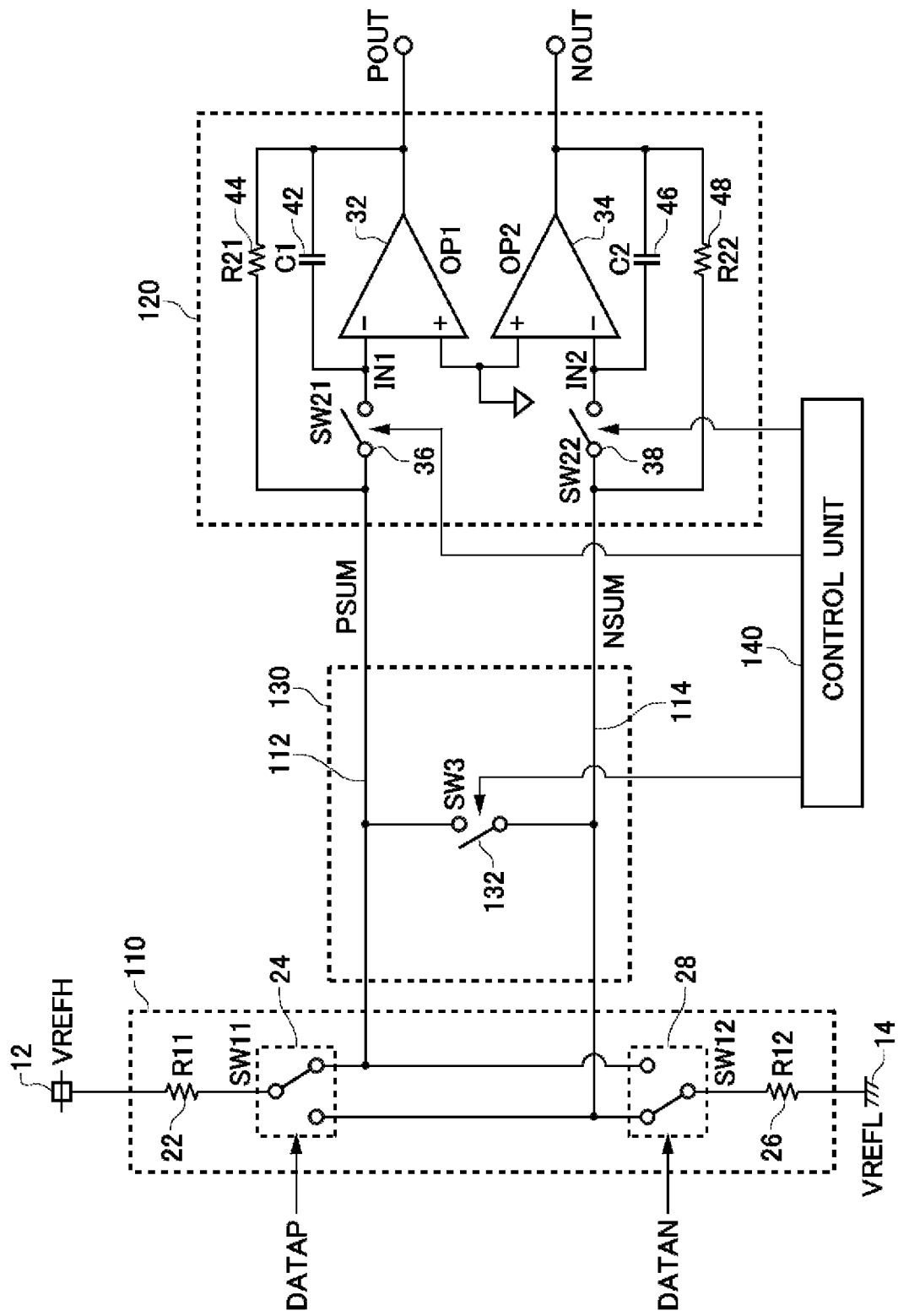
FIG. 1 illustrates an exemplary configuration of a DA converter 10.

FIG. 1 illustrates an exemplary configuration of a DA converter 10. The DA converter 10 converts an input digital signal into a differential analog signal. The DA converter 10 includes a first potential 12, a second potential 14, a current output unit 110, a first wire 112, a second wire 114, a converting unit 120, a connection portion 130, and a control unit 140.

Each of the first potential 12 and the second potential 14 may be a predetermined potential. In addition, each of the first potential 12 and the second potential 14 may be connected to a power supply or the like that supplies a predetermined potential. In addition, the first potential 12 and the second potential 14 are different potentials. FIG. 1 illustrates an example in which the first potential 12 supplies a voltage higher than the second potential 14. In addition, in the illustrated example, the second potential 14 is ground potential (ground potential).

The current output unit 110 outputs a current corresponding to an input digital signal to each of the first wire 112 and the second wire 114. For example, the current output unit 110 outputs a first current corresponding to a positive-side digital signal to one of the first wire 112 and the second wire 114, and outputs a second current corresponding to a negative-side digital signal to the other of the first wire 112 and the second wire 114. Note that the input digital signal may include a positive-side digital signal, and a negative-side digital signal, and instead of this the DA converter 10 may receive either a positive-side digital signal or a negative-side digital signal which is to be subjected to logic inversion, for example, to generate the other digital signal. The current output unit 110 has a first resistor 22, a first output switching unit 24, a second resistor 26, and a second output switching unit 28.

The first resistor 22 is provided between the first potential 12 and the first output switching unit 24. For example, the first resistor 22 has one end that is connected to the first potential 12, and the other end that is connected to the first output switching unit 24.

The first output switching unit 24 switches to which portion the other end of the first resistor 22 is connected, depending on an input digital signal. For example, the first output switching unit 24 electrically connects the other end of the first resistor 22 with either one of the first wire 112 and the second wire 114. FIG. 1 illustrates an example in which a digital signal input to the first output switching unit 24 is a positive-side digital signal DATAP included in a digital signal.

The second resistor 26 is provided between the second output switching unit 28 and the second potential 14. For example, the second resistor 26 has one end that is connected to the second output switching unit 28, and the other end that is connected to the second potential 14.

The second output switching unit 28 switches to which portion the other end of the second resistor 26 is connected, depending on an input digital signal. The second output switching unit 28 electrically connects one end of the second resistor 26 with either one of the first wire 112 and the second wire 114. FIG. 1 illustrates an example in which a digital signal input to the second output switching unit 28 is a negative-side digital signal DATAN included in a digital signal.

Here, if the first output switching unit 24 electrically connects the first resistor 22 with the first wire 112, the second output switching unit 28 electrically connects the second resistor 26 with the second wire 114. In addition, if the first output switching unit 24 electrically connects the first resistor 22 with the second wire 114, the second output switching unit 28 electrically connects the second resistor 26 with the first wire 112. Thereby, the current output unit 110 outputs, to one of the first wire 112 and the second wire 114, a first current based on the first potential 12, and the first resistor 22, and outputs, to the other of the first wire 112 and the second wire 114, a second current based on the second potential 14, and the second resistor 26. Note that the first current may be a current with a positive current value, and the second current may be a current with a negative current value.

The first wire 112 and the second wire 114 are provided between the current output unit 110 and the converting unit 120. FIG. 1 illustrates an example in which the first wire 112 is connected to a positive-side input PSUM of the converting unit 120, and the second wire 114 is connected to a negative-side input NSUM of the converting unit 120.

The converting unit 120 outputs, as a positive-side analog signal, a voltage signal based on a current flowing through the first wire 112, and outputs, as a negative-side analog signal, a voltage signal based on a current flowing through the second wire 114. The converting unit 120 may function as a current-voltage converting circuit. The converting unit 120 has a first amplifying unit 32, a second amplifying unit 34, a positive-side switch 36, a negative-side switch 38, a first feedback capacitor 42, a first feedback resistor 44, a second feedback capacitor 46, and a second feedback resistor 48.

The first amplifying unit 32 and the second amplifying unit 34 may each have an amplifier circuit that amplifies an input signal. FIG. 1 illustrates an example in which the first amplifying unit 32 and the second amplifying unit 34 are operational amplifiers. Here, the negative-side input of the first amplifying unit 32 is defined as IN1, and the negative-side input of the second amplifying unit 34 is defined as IN2. In addition, the positive-side input of the first amplifying unit 32, and the positive-side input of the second amplifying unit 34 are both connected to ground potential.

The positive-side switch 36 is switched to or not to electrically connect the positive-side input PSUM of the converting unit 120 with the negative-side input IN1 of the first amplifying unit 32. The negative-side switch 38 is switched to or not to electrically connect the negative-side input NSUM of the converting unit 120 with the negative-side input IN2 of the second amplifying unit 34. The positive-side switch 36 and the negative-side switch 38 are switched to establish or cut off an electrical connection, depending on a control signal received from the control unit 140.

The first feedback capacitor 42 and the first feedback resistor 44 are each provided between the input and the output of the first amplifying unit 32. FIG. 1 illustrates an example in which the first feedback capacitor 42 is connected between the negative-side input IN1 of the first amplifying unit 32 and the output of the first amplifying unit 32. In addition, in the illustrated example, the first feedback resistor 44 is connected between the positive-side input PSUM and the output of the first amplifying unit 32.

The second feedback capacitor 46 and the second feedback resistor 48 are each provided between the input and the output of the second amplifying unit 34. FIG. 1 illustrates an example in which the second feedback capacitor 46 is connected between the negative-side input IN2 of the second amplifying unit 34 and the output of the second amplifying unit 34. In addition, in the illustrated example, the second feedback resistor 48 is connected between the negative-side input NSUM and the output of the second amplifying unit 34.

The above-mentioned converting unit 120 is charged with current that is input through each of the positive-side input PSUM and the negative-side input NSUM, and outputs a voltage corresponding to the input current. FIG. 1 illustrates an example in which the converting unit 120 outputs, from the positive-side output POUT, a voltage corresponding to an input current to the positive-side input PSUM, and outputs, from the negative-side output NOUT, a voltage corresponding to an input current to the negative-side input NSUM.

The connection portion 130 electrically connects the first wire 112 with the second wire 114, depending on a control signal received from the control unit 140. FIG. 1 illustrates an example in which the connection portion 130 has a connection switch 132. The connection switch 132 is switched to establish or cut off an electrical connection between the first wire 112 and the second wire 114 depending on a control signal received from the control unit 140.

The control unit 140 controls switching of the positive-side switch 36, the negative-side switch 38, and the connection switch 132. The control unit 140 may control switching of the positive-side switch 36, the negative-side switch 38, and the connection switch 132 based on the timing to switch the first output switching unit 24 and the second output switching unit 28.

The above-mentioned DA converter 10 can output a differential analog signal corresponding to an input digital signal. However, such a DA converter 10 generates switching noise at the current output unit 110, accompanying the switching operations of the first output switching unit 24 and the second output switching unit 28. Such switching noise is generated accompanying the switching operations of the first output switching unit 24 and the second output switching unit 28, and increases or reduces the amount of electric charges accumulated in the converting unit 120 depending on an input digital signal; therefore, differential analog signals of the DA converter 10 may be distorted in some cases.

In view of this, in the DA converter 10, the control unit 140 controls the switching of the positive-side switch 36, the negative-side switch 38, and the connection switch 132 to thereby reduce the influence of such switching noise. The switching of individual switches by the control unit 140 is explained next.

Figure 2:
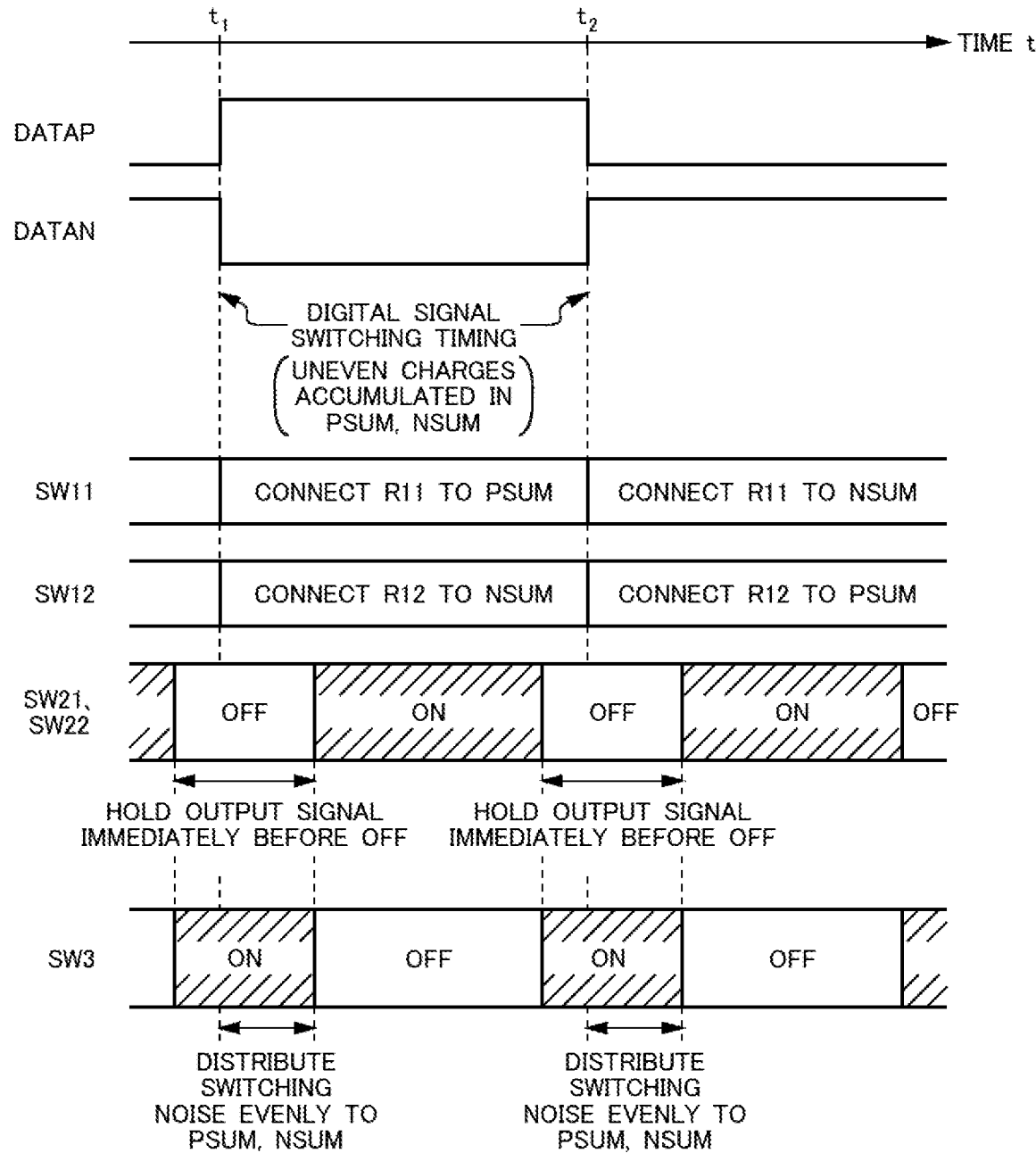
FIG. 2 illustrates exemplary operational timing of the DA converter 10 illustrated in FIG. 1.

FIG. 2 illustrates exemplary operational timing of the DA converter 10 illustrated in FIG. 1. In FIG. 2, the horizontal axis corresponds to time, and the vertical axis corresponds to signal strengths, signal contents, or the like. FIG. 2 illustrates an example in which the positive-side digital signal DATAP and the negative-side digital signal DATAN are each switched at the times $t_1$ and $t_2$. That is, the times $t_1$ and $t_2$ are timing at which electrical connections of the first output switching unit 24 and the second output switching unit 28 each switch. Here, the time $t_1$ is defined as first timing, and the time $t_2$ is defined as second timing.

For example, at the first timing, the first output switching unit 24 electrically connects the other end of the first resistor 22 with the first wire 112. In this case, at the second timing, the first output switching unit 24 electrically disconnects the other end of the first resistor 22 from the first wire 112, and electrically connects the other end of the first resistor 22 with the second wire 114. The operation indicated as "SW11" in FIG. 2 is an example of such a switching operation of the first output switching unit 24.

In this case, at the first timing, the second output switching unit 28 electrically connects one end of the second resistor 26 with the second wire 114. In addition, at the second timing, the second output switching unit 28 electrically disconnects one end of the second resistor 26 from the second wire 114, and electrically connects one end of the second resistor 26 with the first wire 112. The operation indicated as "SW12" in FIG. 2 is an example of such a switching operation of the second output switching unit 28.

The control unit 140 controls switching of the positive-side switch 36, the negative-side switch 38, and the connection switch 132 for such switching operations of the first output switching unit 24 and the second output switching unit 28. For example, the control unit 140 generates and supplies a control signal such that the timing to switch the first output switching unit 24 and the second output switching unit 28 comes after electrical connections of the positive-side switch 36 and the negative-side switch 38 are cut off (turned off), and an electrical connection of the connection switch 132 is established (turned on).

In addition, the control unit 140 generates and supplies a control signal such that the positive-side switch 36 and the negative-side switch 38 are turned on, and the connection switch 132 is turned off after the timing to switch the first output switching unit 24 and the second output switching unit 28. That is, at the timing to switch the first output switching unit 24 and the second output switching unit 28, the control unit 140 turns off the positive-side switch 36 and the negative-side switch 38, and turns on the connection switch 132.

The operations indicated as "SW21" and "SW22" in FIG. 2 illustrate exemplary operations by which the positive-side switch 36 and the negative-side switch 38 are turned off at timing which is a predetermined length of time before the first timing. In addition, the operations indicated as "SW21" and "SW22" illustrate exemplary operations by which the positive-side switch 36 and the negative-side switch 38 are turned on at timing which is a predetermined length of time after the first timing. Similarly, the operations indicated as "SW21" and "SW22" illustrate exemplary operations by which the positive-side switch 36 and the negative-side switch 38 are turned off at timing which is a predetermined length of time before the second timing, and the positive-side switch 36 and the negative-side switch 38 are turned on at timing which is a predetermined length of time after the second timing.

Thereby, even if switching noise is generated at the switching timing of the current output unit 110, it is possible to prevent a signal component on which the switching noise is superimposed from being input to the first amplifying unit 32 and the second amplifying unit 34. In this case, this results in the converting unit 120 outputting, from the positive-side output POUT and the negative-side output NOUT, output signals immediately before the positive-side switch 36 and the negative-side switch 38 are turned off.

In addition, the operation indicated as "SW3" in FIG. 2 illustrates an exemplary operation by which the connection switch 132 is turned on at timing which is a predetermined length of time before the first timing, and the connection switch 132 is turned off at timing which is a predetermined length of time after the first timing. Similarly, the operation indicated as "SW3" in FIG. 2 illustrates an exemplary operation by which the connection switch 132 is turned on at timing which is a predetermined length of time before the second timing, and the connection switch 132 is turned off at timing which is a predetermined length of time after the second timing.

In this manner, since the control unit 140 electrically connects the first wire 112 with the second wire 114 at the switching timing of the current output unit 110, even if switching noise is generated, the noise component is distributed evenly to the positive-side input PSUM and the negative-side input NSUM of the converting unit 120. Accordingly, if the first output switching unit 24 and the second output switching unit 28 are turned on upon a lapse of a predetermined length of time after the switching timing of the current output unit 110, a differential analog signal on which the noise component is evenly superimposed is output from the positive-side output POUT and the negative-side output NOUT. Accordingly, by taking the difference between the positive-side signal and the negative-side signal of the differential analog signal, the noise component can be cancelled out.

As mentioned above, the DA converter 10 can convert an input digital signal into an analog signal while at the same time reducing switching noise. Note that, in such a DA converter 10, the DA converter 10 can cancel out noise components if an ideal circuit configuration in which the resistances of the first resistor 22 and the second resistor 26 do not have relative differences, and the first amplifying unit 32 and the second amplifying unit 34 have the same characteristics is formed. However, it is difficult to form an ideal circuit configuration. For example, relative differences of the resistances of the first resistor 22 and the second resistor 26 are generated in some cases, and the operation bands or the like of the first amplifying unit 32 and the second amplifying unit 34 are finite, and generate differences in some cases.

Accordingly, a situation occurs where even if the first wire 112 and the second wire 114 are electrically connected, switching noise is distributed not evenly, and even if the difference between the positive-side signal and the negative-side signal of a differential analog signal is taken, the noise component cannot be cancelled out sufficiently. In view of this, the DA converter 100 according to the present embodiment is provided with a circuit to reduce switching noise at each of the first wire 112 and the second wire 114, and allows reduction of switching noise even if differences are generated in the constants, characteristic, or the like of circuit elements. Such a DA converter 100 is explained next.

Figure 3:
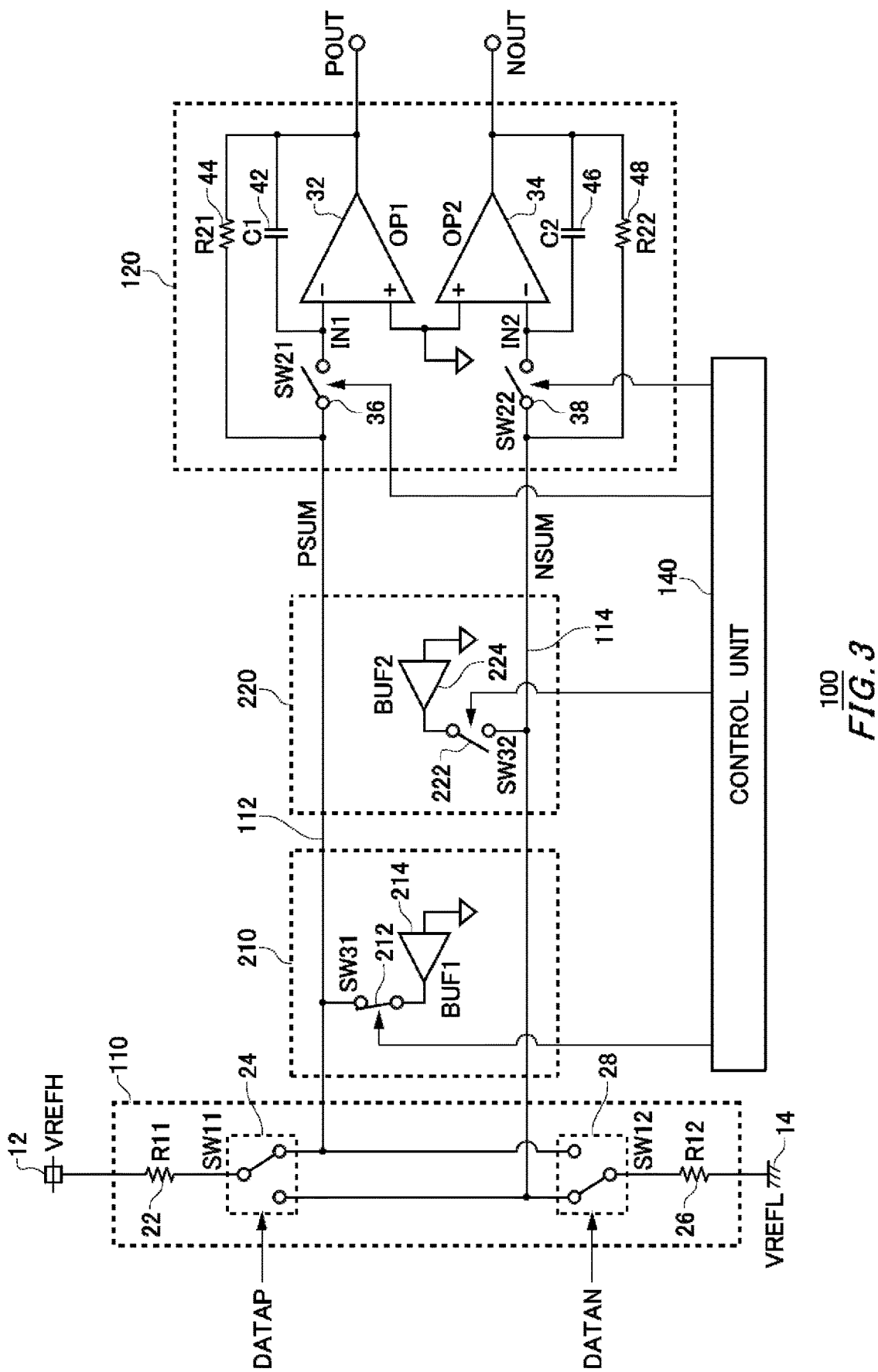
FIG. 3 illustrates an exemplary configuration of a DA converter 100 according to the present embodiment.

FIG. 3 illustrates an exemplary configuration of the DA converter 100 according to the present embodiment. The DA converter 100 outputs a differential analog signal corresponding to an input digital signal. Operations of the DA converter 100 according to the present embodiment that are approximately the same as those of the operations of the DA converter 10 illustrated in FIG. 1 are given the same symbols, and explanations thereof are omitted. Instead of the connection portion 130 in the DA converter 10, the DA converter 100 includes a first noise reducing unit 210, and a second noise reducing unit 220.

The first noise reducing unit 210 reduces a noise component generated at the current output unit 110. The first noise reducing unit 210 has a first switch 212, and a first buffer 214. The first switch 212 is switched to or not to electrically connect the first noise reducing unit 210 with the first wire 112. The first switch 212 is switched to establish an electrical connection (turned on) or to cut off an electrical connection (turned off) depending on a control signal supplied from the control unit 140.

The first buffer 214 is provided between the first switch 212 and a reference potential. Note that the reference potential may be ground potential. The first buffer 214 has an input terminal that is connected to the reference potential, and an output terminal that is connected to the first switch 212. Accordingly, for example, if electric charges resulting from a noise component are accumulated at a parasitic capacitance or the like of the positive-side input PSUM of the converting unit 120 connected to the first wire 112, and the first switch 212 is turned on, the first buffer 214 operates to discharge the accumulated electric charges. That is, if the first switch 212 is turned on, the first noise reducing unit 210 discharges electric charges accumulated in the converting unit 120 via the first wire 112 due to a noise component generated at the current output unit 110.

The second noise reducing unit 220 reduces a noise component generated at the current output unit 110. The second noise reducing unit 220 has a second switch 222, and a second buffer 224. The second switch 222 is switched to or not to electrically connect the second noise reducing unit 220 with the second wire 114. The second switch 222 is switched to establish an electrical connection (turned on) or to cut off an electrical connection (turned off) depending on a control signal supplied from the control unit 140.

The second buffer 224 is provided between the second switch 222 and a reference potential. Note that the reference potential may be ground potential. The second buffer 224 has an input terminal that is connected to the reference potential, and has an output terminal that is connected to the second switch 222. Accordingly, for example, if electric charges resulting from a noise component are accumulated at a parasitic capacitance or the like of the negative-side input NSUM of the converting unit 120 connected to the second wire 114, and the second switch 222 is turned on, the second buffer 224 operates to discharge the accumulated electric charges. That is, if the second switch 222 is turned on, the second noise reducing unit 220 discharges electric charges accumulated in the converting unit 120 via the second wire 114 due to a noise component generated at the current output unit 110.

Similar to the control unit 140 of the DA converter 10 illustrated in FIG. 1, the control unit 140 provided to the DA converter 100 according to the above-mentioned present embodiment controls the switching of the positive-side switch 36 and the negative-side switch 38. In addition, the control unit 140 controls the connection states of the first switch 212 and the second switch 222. The switching of individual switches by the control unit 140 is explained next.

Figure 4:
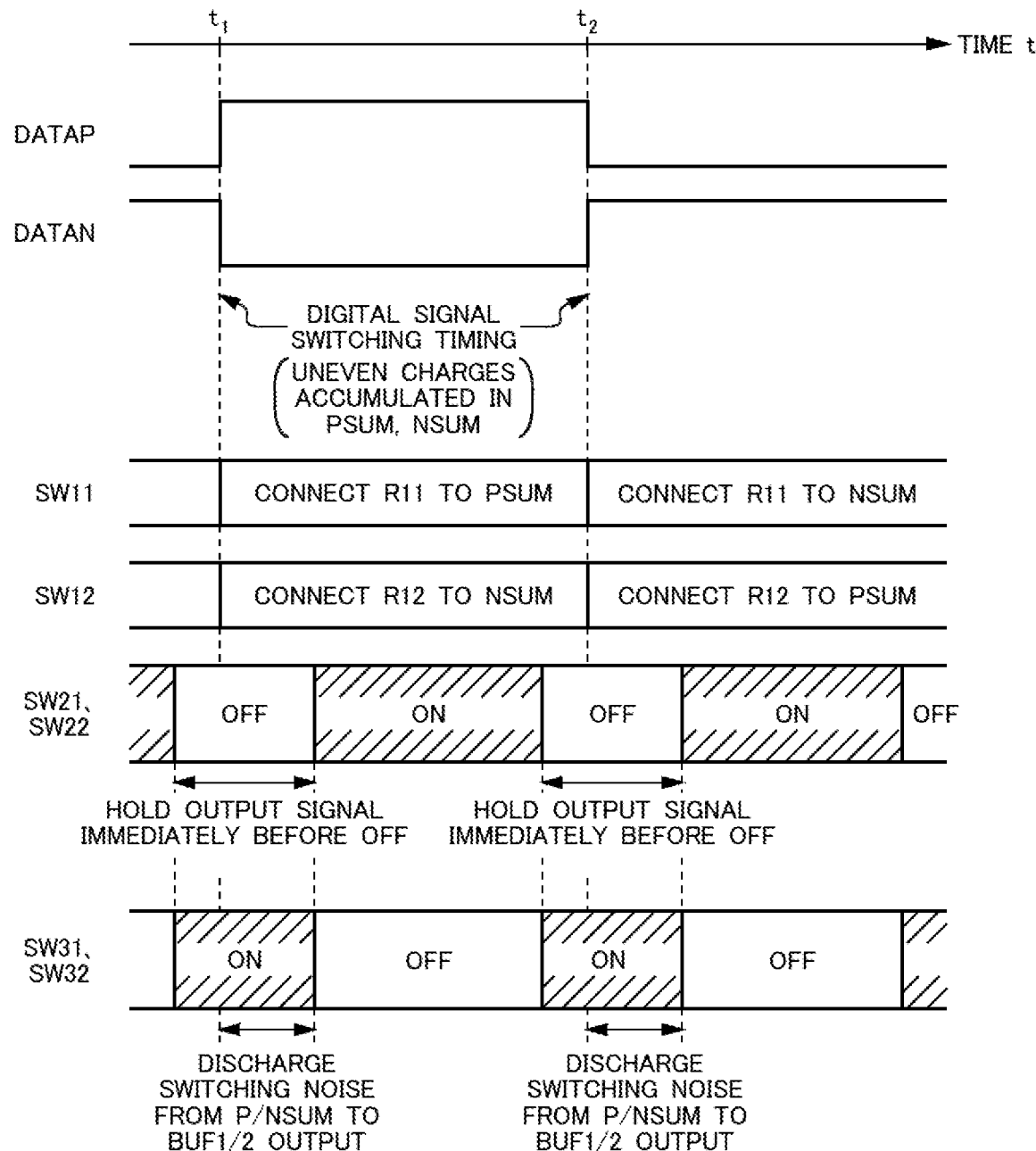
FIG. 4 illustrates exemplary operational timing of the DA converter 100 according to the present embodiment.

FIG. 4 illustrates exemplary operational timing of the DA converter 100 according to the present embodiment illustrated in FIG. 3. In FIG. 4, the horizontal axis corresponds to time, and the vertical axis corresponds to signal strengths, signal contents, or the like. Similar to FIG. 2, FIG. 4 illustrates an example in which the positive-side digital signal DATAP and the negative-side digital signal DATAN are each switched at the times $t_1$ and $t_2$. In view of this, similar to the explanation with reference to FIG. 2, the time $t_1$ is defined as first timing, and the time $t_2$ is defined as second timing. In addition, since the operations of "SW11" and "SW12" illustrated in FIG. 4 are the same as the operations indicated as "SW11" and "SW12" explained with reference to FIG. 2, respectively, explanations thereof are omitted here.

The control unit 140 controls switching of the positive-side switch 36 and the negative-side switch 38, for such switching operations of the first output switching unit 24 and the second output switching unit 28. For example, the control unit 140 generates and supplies a control signal such that the timing to switch the first output switching unit 24 and the second output switching unit 28 comes after electrical connections of the positive-side switch 36 and the negative-side switch 38 are cut off (turned off), and an electrical connection of the connection switch 132 is established (turned on).

In addition, the control unit 140 generates and supplies a control signal such that the positive-side switch 36 and the negative-side switch 38 are turned on after the timing to switch the first output switching unit 24 and the second output switching unit 28. That is, at the timing to switch the first output switching unit 24 and the second output switching unit 28, the control unit 140 turns off the positive-side switch 36 and the negative-side switch 38.

The operations indicated as "SW21" and "SW22" in FIG. 4 illustrate exemplary operations by which the positive-side switch 36 and the negative-side switch 38 are turned off at timing which is a predetermined length of time before the first timing. In addition, the operations indicated as "SW21" and "SW22" illustrate exemplary operations by which the positive-side switch 36 and the negative-side switch 38 are turned on at timing which is a predetermined length of time after the first timing. Similarly, the operations indicated as "SW21" and "SW22" illustrate exemplary operations by which the positive-side switch 36 and the negative-side switch 38 are turned off at timing which is a predetermined length of time before the second timing, and the positive-side switch 36 and the negative-side switch 38 are turned on at timing which is a predetermined length of time after the second timing.

Thereby, even if switching noise is generated at the switching timing of the current output unit 110, it is possible to prevent a signal component on which the switching noise is superimposed from being input to the first amplifying unit 32 and the second amplifying unit 34. In this case, this results in the converting unit 120 outputting, from the positive-side output POUT and the negative-side output NOUT, output signals immediately before the positive-side switch 36 and the negative-side switch 38 are turned off.

In addition, the control unit 140 controls the timing to switch the connection states of the first switch 212 and the second switch 222 such that timing at which the digital value of a digital signal is switched comes after the first switch 212 and the second switch 222 are turned on. The operations indicated as "SW31" and "SW32" in FIG. 4 illustrate exemplary operations by which the first switch 212 and the second switch 222 are turned on at timing which is a predetermined length of time before the first timing. In addition, the operations indicated as "SW31" and "SW32" illustrate exemplary operations by which the first switch 212 and the second switch 222 are turned off at timing which is a predetermined length of time after the first timing.

Similarly, the operations indicated as "SW31" and "SW32" illustrate exemplary operations by which the first switch 212 and the second switch 222 are turned on at timing which is a predetermined length of time before the second timing, and the first switch 212 and the second switch 222 are turned off at timing which is a predetermined length of time after the second timing.

Note that FIG. 4 illustrates an example in which the timing to switch the first switch 212 and the second switch 222, and the timing to switch the positive-side switch 36 and the negative-side switch 38 are approximately the same, but this is not the sole example. For example, the first switch 212 and the second switch 222 may be switched on after the positive-side switch 36 and the negative-side switch 38 are switched off. In addition, the first switch 212 and the second switch 222 may be switched off before the positive-side switch 36 and the negative-side switch 38 are switched on.

In this manner, the control unit 140 discharges, from each of the first wire 112 and the second wire 114, electric charges accumulated in the converting unit 120 at the switching timing of the current output unit 110. Thereby, even if switching noise is generated in the current output unit 110, the DA converter 100 can reduce electric charges accumulated based on the noise.

In addition, the DA converter 100 has the first noise reducing unit 210 provided at the first wire 112, and has the second noise reducing unit 220 provided at the second wire 114, and each of the first noise reducing unit 210 and the second noise reducing unit 220 discharges electric charges from the corresponding input of the converting unit 120. That is, the DA converter 100 can discharge and reduce electric charges resulting from switching noise before taking the difference between the positive-side signal and the negative-side signal of a differential analog signal. Accordingly, the DA converter 100 can reduce switching noise even if differences of constants, characteristics, or the like of circuit elements occur.

Although in the example explained, the first noise reducing unit 210 and the second noise reducing unit 220 of the DA converter 100 according to the above-mentioned present embodiment each have a buffer circuit, this is not the sole example. Instead of the buffer circuit or in addition to the buffer circuit, the first noise reducing unit 210 and the second noise reducing unit 220 may have capacitance elements or the like.

Figure 5:
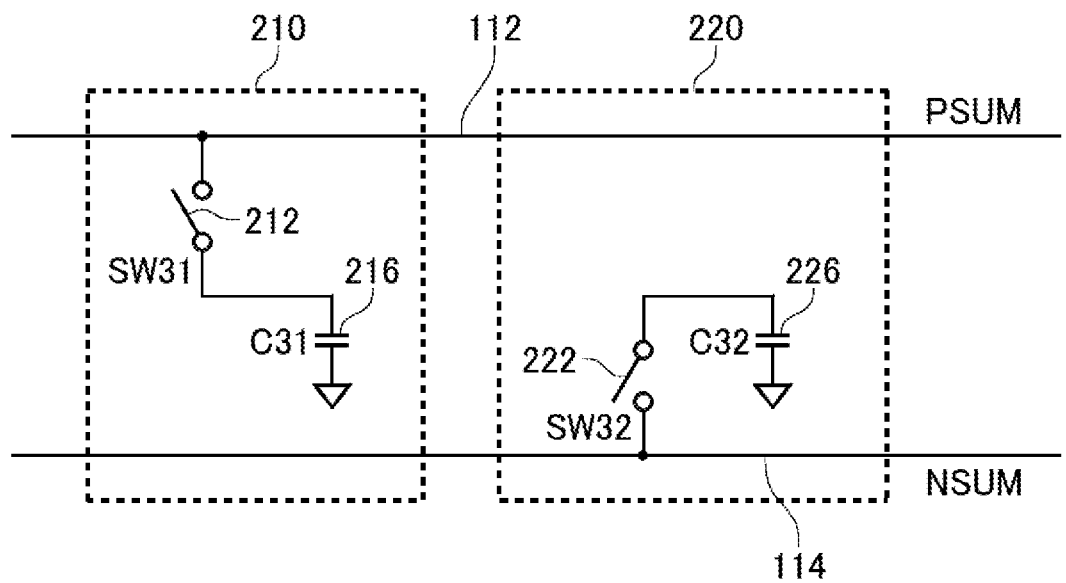
FIG. 5 illustrates a first variant of a first noise reducing unit 210 and a second noise reducing unit 220 according to the present embodiment.

FIG. 5 illustrates a first variant of the first noise reducing unit 210 and the second noise reducing unit 220 according to the present embodiment. The first noise reducing unit 210 in the first variant has a first capacitor 216 that is provided between the first switch 212 and the reference potential, and in series with the first switch 212. In addition, the second noise reducing unit 220 in the first variant has a second capacitor 226 that is provided between the second switch 222 and the reference potential, and in series with the second switch 222.

In this manner, even if the first noise reducing unit 210 and the second noise reducing unit 220 have capacitance elements or the like instead of buffer circuits, each of them can discharge electric charges through the corresponding input of the converting unit 120 by the control unit 140 executing the operations like those illustrated in FIG. 4. Note that desirably the capacitance of the first capacitor 216 is sufficiently higher than the parasitic capacitance of the positive-side input PSUM, and the capacitance of the second capacitor 226 is sufficiently higher than the parasitic capacitance of the negative-side input NSUM. Thereby, it becomes possible to discharge electric charges based on switching noise, and improve distortion characteristics of the DA converter 100.

Figure 6:
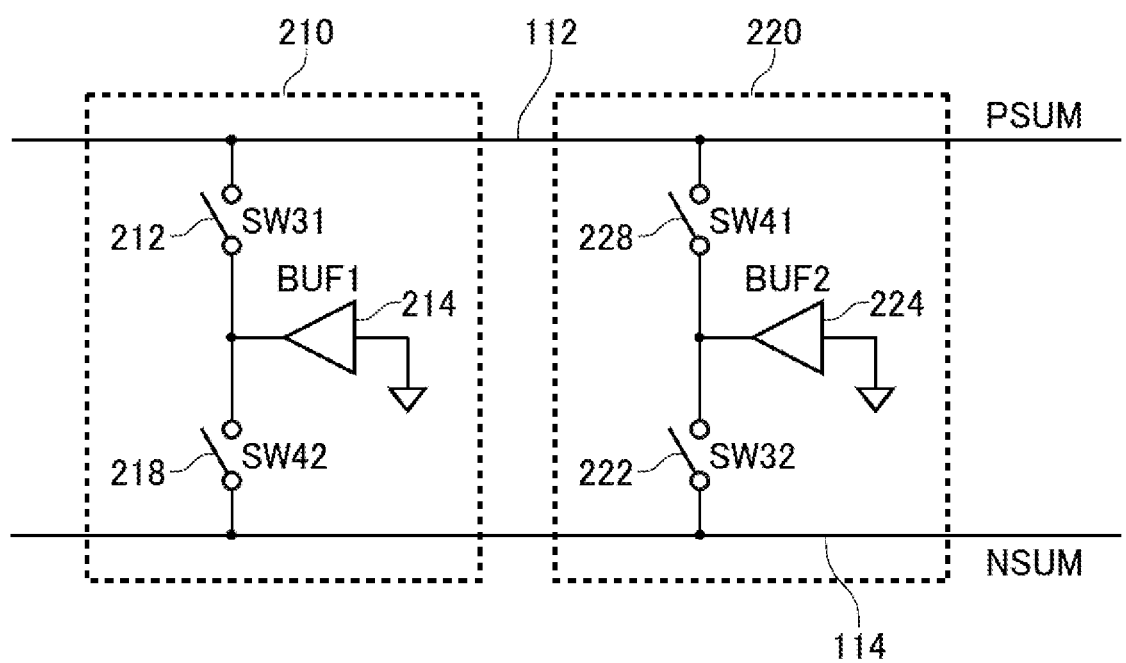
FIG. 6 illustrates a second variant of the first noise reducing unit 210 and the second noise reducing unit 220 according to the present embodiment.

FIG. 6 illustrates a second variant of the first noise reducing unit 210 and the second noise reducing unit 220 according to the present embodiment. The first noise reducing unit 210 in the second variant further has a third switch 218 in addition to the first switch 212 and the first buffer 214. The third switch 218 is provided between the first wire 112 and the second wire 114, and in series with the first switch 212. In this case, the first buffer 214 is provided between (i)

a point between the first switch 212 and the third switch 218, and (ii) the reference potential.

In addition, the second noise reducing unit 220 in the second variant further has a fourth switch 228 in addition to the second switch 222 and the second buffer 224. The fourth switch 228 is provided between the first wire 112 and the second wire 114, and in series with the second switch 222. In this case, the second buffer 224 is provided between (i) a point between the second switch 222 and the fourth switch 228, and (ii) the reference potential.

For the first noise reducing unit 210 and the second noise reducing unit 220 in the second variant like these, the control unit 140 alternately repeats a period during which the first switch 212 and the second switch 222 are turned on, and a period during which the third switch 218 and the fourth switch 228 are turned on. Such switching of individual switches by the control unit 140 is explained next.

Figure 7:
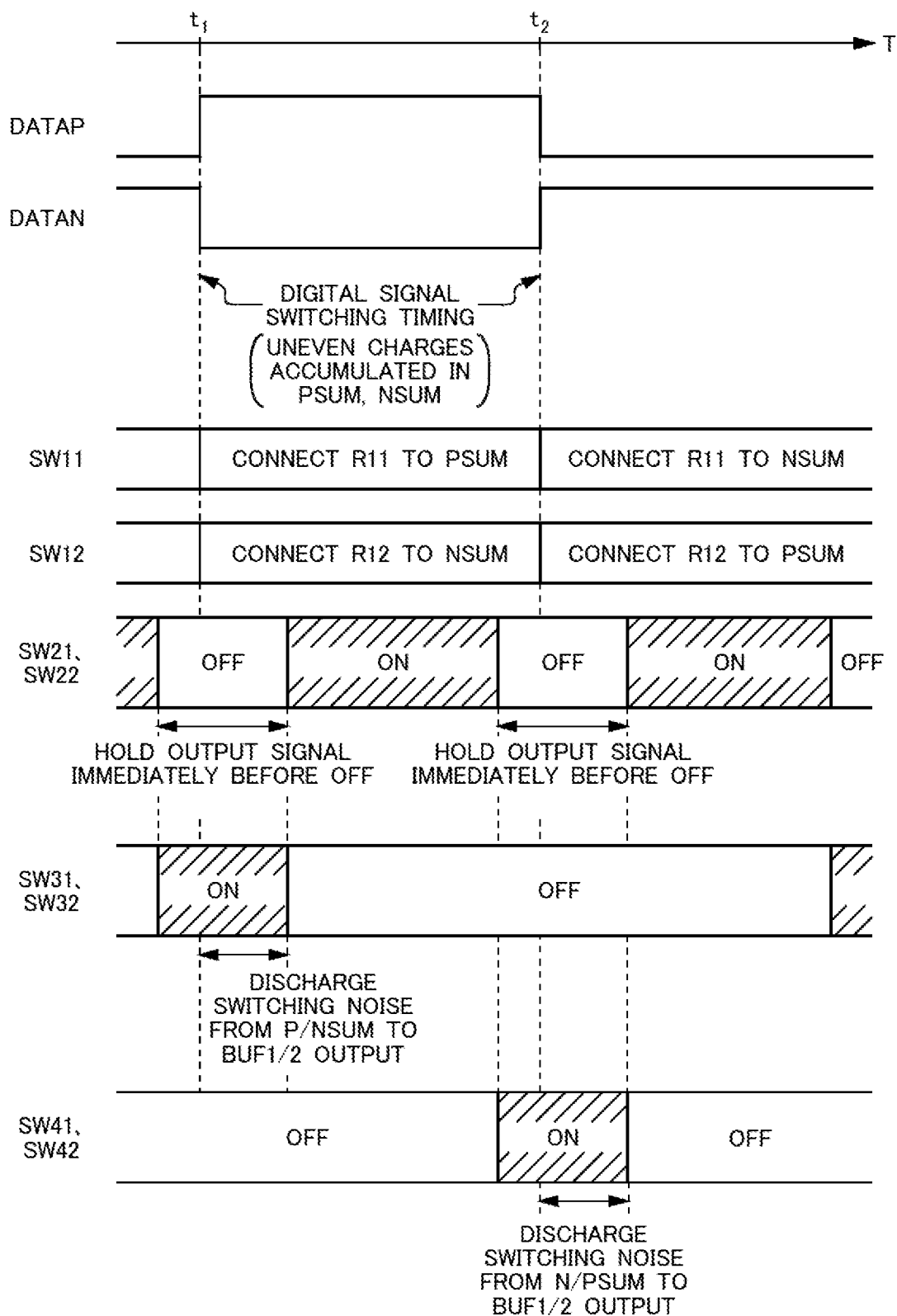
FIG. 7 illustrates exemplary operational timing of the DA converter 100 provided with the first noise reducing unit 210 and the second noise reducing unit 220 of the second variant illustrated in FIG. 6.

FIG. 7 illustrates exemplary operational timing of the DA converter 100 provided with the first noise reducing unit 210 and the second noise reducing unit 220 of the second variant illustrated in FIG. 6. In FIG. 7, the horizontal axis corresponds to time, and the vertical axis corresponds to signal strengths, signal contents, or the like. Similar to FIG. 2, FIG. 7 illustrates an example in which the positive-side digital signal DATAP and the negative-side digital signal DATAN are each switched at the times $t_1$ and $t_2$. In view of this, similar to the explanation with reference to FIG. 2, the time $t_1$ is defined as first timing, and the time $t_2$ is defined as second timing. In addition, since the operations of "SW11" and "SW12" illustrated in FIG. 7 are the same as the operations indicated as "SW11" and "SW12" explained with reference to FIG. 2, respectively, explanations thereof are omitted here.

The control unit 140 controls switching of the positive-side switch 36 and the negative-side switch 38, for such switching operations of the first output switching unit 24 and the second output switching unit 28. For example, the control unit 140 generates and supplies a control signal such that the timing to switch the first output switching unit 24 and the second output switching unit 28 comes after electrical connections of the positive-side switch 36 and the negative-side switch 38 are cut off (turned off), and an electrical connection of the connection switch 132 is established (turned on). Since the operations of "SW21" and "SW22" illustrated in FIG. 7 are the same as the operations indicated as "SW21" and "SW22" explained with reference to FIG. 4, respectively, explanations thereof are omitted here.

Then, the control unit 140 controls the timing to switch the connection states of the first switch 212 and the third switch 218 such that the first timing comes after the first switch 212 is turned on, and the third switch 218 is turned off. That is, the control unit 140 controls individual switches such that the first timing comes after an electrical connection between the first wire 112 and the first buffer 214 is established, and an electrical connection between the second wire 114 and the first buffer 214 is cut off.

The operation "SW31" illustrated in FIG. 7 illustrates an exemplary operation by which the first switch 212 is turned on at timing which is a predetermined length of time before the first timing. In addition, the operation indicated as "SW31" illustrates an exemplary operation by which the first switch 212 is turned off at timing which is a predetermined length of time after the first timing. Note that the third switch 218 is kept turned off even in a period while the first switch 212 is turned on, as indicated by "SW41".

In addition, the control unit 140 controls the timing to switch the connection states of the second switch 222 and the fourth switch 228 such that the first timing comes after the second switch 222 is turned on, and the fourth switch 228 is turned off. That is, the control unit 140 controls individual switches such that the first timing comes after an electrical connection between the second wire 114 and the second buffer 224 is established, and an electrical connection between the first wire 112 and the second buffer 224 is cut off.

The operation "SW32" illustrated in FIG. 7 illustrates an exemplary operation by which the second switch 222 is turned on at timing which is a predetermined length of time before the first timing. In addition, the operation indicated as "SW32" illustrates an exemplary operation by which the second switch 222 is turned off at timing which is a predetermined length of time after the first timing. Note that the fourth switch 228 is kept turned off even in a period while the second switch 222 is turned on, as indicated by "SW42".

Thereby, the operations at the first timing of "SW31" and "SW32" illustrated in FIG. 7 become the same as the operations at the first timing of "SW31" and "SW32" illustrated in FIG. 4. That is, at the first timing, the first noise reducing unit 210 and the second noise reducing unit 220 in the second variant discharge electric charges accumulated in the converting unit 120 through each of the first wire 112 and the second wire 114.

As mentioned above, the control unit 140 turns off the first switch 212 and the second switch 222 after the first timing. Then, the control unit 140 keeps the first switch 212 and the second switch 222 turned off until after the second timing. The operations of "SW31" and "SW32" illustrated in FIG. 7 illustrate an example in which the first switch 212 and the second switch 222 are kept turned off even at the second timing.

In addition, the control unit 140 controls the connection states of the third switch 218 and the fourth switch 228 such that the second timing that follows the first timing comes after the first switch 212 and the second switch 222 are turned off, and then the third switch 218 and the fourth switch 228 are turned on. That is, the control unit 140 controls individual switches such that the second timing comes after an electrical connection between the second wire 114 and the first buffer 214 is established, and an electrical connection between the first wire 112 and the second buffer 224 is established.

The operations of "SW41" and "SW42" illustrated in FIG. 7 illustrate exemplary operations by which the third switch 218 and the fourth switch 228 are turned on at timing which is a predetermined length of time before the second timing. In addition, the operations indicated as "SW41" and "SW42" illustrate exemplary operations by which the third switch 218 and the fourth switch 228 are turned off at timing which is a predetermined length of time after the second timing.

In this manner, the first noise reducing unit 210 in the second variant electrically connects the first buffer 214 with the first wire 112 at the first timing, and the first buffer 214 with the second wire 114 at the second timing. That is, the first buffer 214 discharges electric charges accumulated in the converting unit 120 while the portion to which the first buffer 214 is connected is sequentially switched to one of the first wire 112 and the second wire 114 at each of the timing. Thereby, for example, even if a noise component and/or an offset voltage, or the like is superimposed on an output from the first buffer 214, the superimposed component can be distributed evenly between the first wire 112 and the second wire 114. That is, it is possible to prevent distortion in an output from the DA converter 100 from being generated, due to the first noise reducing unit 210.

Similarly, the second noise reducing unit 220 in the second variant electrically connects the second buffer 224 with the second wire 114 at the first timing, and the second buffer 224 with the first wire 112 at the second timing. That is, the second buffer 224 discharges electric charges accumulated in the converting unit 120 while the portion to which the second buffer 224 is connected is sequentially switched, at each of the timing, to the other of the first wire 112 and the second wire 114 with which the first buffer 214 is not connected. Thereby, for example, even if a noise component and/or an offset voltage, or the like is superimposed on an output from the second buffer 224, the superimposed component can be distributed evenly between the first wire 112 and the second wire 114. That is, it is possible to prevent distortion in an output from the DA converter 100 from being generated, due to the second noise reducing unit 220.

As mentioned above, the DA converter 100 according to the present embodiment can reduce distortion of an output analog signal since it is provided with the first noise reducing unit 210 and the second noise reducing unit 220 even if differences of constants or the like of circuit elements constituting converting circuits occur. In addition, even if a noise component based on characteristics of circuit elements of the first noise reducing unit 210 and the second noise reducing unit 220 occurs, the DA converter 100 can prevent distortion of an output analog signal from occurring by switching the portions to which the first noise reducing unit 210 and the second noise reducing unit 220 are connected.

In the example explained, the control unit 140 according to the above-mentioned present embodiment generates a control signal to control switches or the like at a time prior to the first timing and the second timing. Such a control unit 140 may, for example, receive an input digital signal in advance, and generate a control signal. In addition, the current output unit 110 may receive a digital signal input through a delay circuit, and the control unit 140 may receive a digital signal input not through a delay circuit, and generate a control signal. In this case, the DA converter 100 may further include the delay circuit.

In addition, the first noise reducing unit 210 according to the present embodiment may have a first reference voltage forcing unit that forces a reference voltage across the first wire, and the second noise reducing unit 220 may have a second reference voltage forcing unit that forces a reference voltage across the second wire. The first reference voltage forcing unit may include the first buffer 214 or first capacitor 216. The second reference voltage forcing unit may include the second buffer 224 or second capacitor 226.

Various embodiments of the present invention may be described with reference to flowcharts and block diagrams whose blocks may represent (1) steps of processes in which operations are performed or (2) units of apparatuses responsible for performing operations. Certain steps and units may be implemented by dedicated circuitry, programmable circuitry supplied with computer-readable instructions stored on computer-readable media, and/or processors supplied with computer-readable instructions stored on computer-readable media.

Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams.

Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY(registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A DA converter that outputs a differential analog signal corresponding to an input digital signal, the DA converter comprising:
a current output unit that outputs a current corresponding to the digital signal to each of a first wire and a second wire;
a converting unit that outputs, as a positive-side analog signal, a voltage signal based on a current flowing through the first wire, and outputs, as a negative-side analog signal, a voltage signal based on a current flowing through the second wire;
a first noise reducing unit having: a first switch that is switched to be or not to be electrically connected with the first wire to receive the current output by the current unit from the first wire; and a first buffer provided between the first switch and a reference potential; and
a second noise reducing unit having: a second switch that is switched to be or not to be electrically connected with the second wire to receive the current output by the current unit from the first wire; and a second buffer provided between the second switch and the reference potential.

2. A DA converter that outputs a differential analog signal corresponding to an input digital signal, the DA converter comprising:
a current output unit that outputs a current corresponding to the digital signal to each of a first wire and a second wire;
a converting unit that outputs, as a positive-side analog signal, a voltage signal based on a current flowing through the first wire, and outputs, as a negative-side analog signal, a voltage signal based on a current flowing through the second wire;
a first noise reducing unit having: a first switch that is switched to be or not to be electrically connected with the first wire to receive the current output by the current unit from the first wire; and a first capacitor provided between the first switch and a reference potential; and
a second noise reducing unit having: a second switch that is switched to be or not to be electrically connected with the second wire to receive the current output by the current unit from the second wire; and a second capacitor provided between the second switch and the reference potential.

3. The DA converter according to claim 1, wherein
while the first switch is turned on, the first noise reducing unit discharges electric charges accumulated in the converting unit due to a noise component generated at the current output unit; and
while the second switch is turned on, the second noise reducing unit discharges electric charges accumulated in the converting unit due to a noise component generated at the current output unit.

4. The DA converter according to claim 2, wherein
while the first switch is turned on, the first noise reducing unit discharges electric charges accumulated in the converting unit due to a noise component generated at the current output unit; and
while the second switch is turned on, the second noise reducing unit discharges electric charges accumulated in the converting unit due to a noise component generated at the current output unit.

5. The DA converter according to claim 1, wherein
the first noise reducing unit further has a third switch provided between the first wire and the second wire, and in series with the first switch, and
the first buffer is provided between (i) a point between the first switch, and the third switch, and (ii) the reference potential.

6. The DA converter according to claim 5, wherein
the second noise reducing unit further has a fourth switch provided between the first wire and the second wire, and in series with the second switch, and
the second buffer is provided between (i) a point between the second switch and the fourth switch, and (ii) the reference potential.

7. The DA converter according to claim 6, comprising a control unit that controls connection states of the first switch and the second switch, wherein
the control unit controls timing to switch the connection states of the first switch to the fourth switch such that first timing at which a digital value of the digital signal is switched comes after:
the first switch is turned on to establish an electrical connection between the first wire and the first buffer;
the third switch is turned off to cut off an electrical connection between the second wire and the first buffer;
the second switch is turned on to establish an electrical connection between the second wire and the second buffer; and
the fourth switch is turned off to cut off an electrical connection between the first wire and the second buffer.

8. The DA converter according to claim 7, wherein the control unit turns off the first switch and the second switch after the first timing.

9. The DA converter according to claim 8, wherein
after the first switch and the second switch are turned off, the control unit controls the connection states of the first switch to the fourth switch such that second timing that follows the first timing and at which the digital value of the digital signal is switched comes after:
the third switch is turned on to establish an electrical connection between the second wire and the first buffer; and
the fourth switch is turned on to establish an electrical connection between the first wire and the second buffer.

10. The DA converter according to claim 1, wherein the current output unit outputs a first current corresponding to a positive-side digital signal to one of the first wire and the second wire, and outputs a second current corresponding to a negative-side digital signal to the other of the first wire and the second wire.

11. The DA converter according to claim 2, wherein the current output unit outputs a first current corresponding to a positive-side digital signal to one of the first wire and the second wire, and outputs a second current corresponding to a negative-side digital signal to the other of the first wire and the second wire.

12. The DA converter according to claim 1, comprising a control unit that controls connection states of the first switch and the second switch, wherein
the control unit controls timing to switch the connection states of the first switch and the second switch such that timing at which a digital value of the digital signal is switched comes after the first switch and the second switch are turned on.

13. The DA converter according to claim 2, comprising a control unit that controls connection states of the first switch and the second switch, wherein the control unit controls timing to switch the connection states of the first switch and the second switch such that timing at which a digital value of the digital signal is switched comes after the first switch and the second switch are turned on.

14. A DA converter that outputs a differential analog signal corresponding to an input digital signal, the DA converter comprising:
   a current output unit that outputs a current corresponding to the digital signal to each of a first wire and a second wire;
   a converting unit that outputs, as a positive-side analog signal, a voltage signal based on a current flowing through the first wire, and outputs, as a negative-side analog signal, a voltage signal based on a current flowing through the second wire;
   a first noise reducing unit that is electrically connected with the first wire to receive the current output by the current unit from the first wire, and discharges electric charges corresponding to a noise component generated at the current output unit; and
   a second noise reducing unit that is electrically connected with the second wire to receive the current output by the current unit from the second wire, and discharges electric charges corresponding to a noise component generated at the current output unit.

15. A DA converter that outputs a differential analog signal corresponding to an input digital signal, the DA converter comprising:
   a current output unit that outputs a current corresponding to the digital signal to each of a first wire and a second wire;
   a converting unit that outputs, as a positive-side analog signal, a voltage signal based on a current flowing through the first wire, and outputs, as a negative-side analog signal, a voltage signal based on a current flowing through the second wire;
   a first reference voltage forcing unit that receive the current output by the current unit from the first wire and forces a reference voltage across the first wire; and
   a second reference voltage forcing unit that receive the current output by the current unit from the second wire and forces a reference voltage across the second wire.

16. A DA conversion method of outputting a differential analog signal corresponding to an input digital signal, the DA conversion method comprising:
   outputting a current corresponding to the digital signal to each of a first wire and a second wire;
   electrically connecting a first buffer provided to the first wire with the first wire via a first switch;
   electrically connecting a second buffer provided to the second wire with the second wire via a second switch; and
   outputting, as a positive-side analog signal, a voltage signal based on a current flowing through the first wire after the first switch is switched to cut off an electrical connection, and outputting, as a negative-side analog signal, a voltage signal based on a current flowing through the second wire after the second switch is switched to cut off an electrical connection.

17. A DA converter that outputs a differential analog signal corresponding to an input digital signal, the DA converter comprising:
   a current output unit that outputs a current corresponding to the digital signal to each of a first wire and a second wire;
   a converting unit that outputs, as a positive-side analog signal, a voltage signal based on a current flowing through the first wire, and outputs, as a negative-side analog signal, a voltage signal based on a current flowing through the second wire;
   a first noise reducing unit having: a first switch that is switched to be or not to be electrically connected with the first wire; and a first buffer provided between the first switch and a reference potential;
   a second noise reducing unit having: a second switch that is switched to be or not to be electrically connected with the second wire; and a second buffer provided between the second switch and the reference potential, and
   a control unit that controls connection states of the first switch and the second switch, wherein
   the first noise reducing unit further has a third switch provided between the first wire and the second wire, and in series with the first switch,
   the first buffer is provided between (i) a point between the first switch, and the third switch, and (ii) the reference potential,
   the second noise reducing unit further has a fourth switch provided between the first wire and the second wire, and in series with the second switch, and
   the second buffer is provided between (i) a point between the second switch and the fourth switch, and (ii) the reference potential,
   the control unit controls timing to switch the connection states of the first switch, the second switch, the third switch, and the fourth switch such that a first timing at which a digital value of the digital signal is switched is after:
      the first switch is turned on to establish an electrical connection between the first wire and the first buffer;
      the third switch is turned off to cut off an electrical connection between the second wire and the first buffer;
      the second switch is turned on to establish an electrical connection between the second wire and the second buffer; and
      the fourth switch is turned off to cut off an electrical connection between the first wire and the second buffer.

* * * * *